US012589989B2

(12) United States Patent
Longoni et al.

(10) Patent No.: US 12,589,989 B2
(45) Date of Patent: Mar. 31, 2026

(54) PROCESS FOR MANUFACTURING A MICRO-ELECTRO-MECHANICAL DEVICE FROM A SINGLE SEMICONDUCTOR WAFER AND RELATED MEMS DEVICE

(71) Applicant: STMICROELECTRONICS S.R.L., Agrate Brianza (IT)

(72) Inventors: Gianluca Longoni, Cernusco sul Naviglio (IT); Luca Seghizzi, Milan (IT); Andrea Nomellini, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 695 days.

(21) Appl. No.: 17/933,439

(22) Filed: Sep. 19, 2022

(65) Prior Publication Data

US 2023/0107094 A1     Apr. 6, 2023

(30) Foreign Application Priority Data

Sep. 28, 2021     (IT) ........................ 102021000024785

(51) Int. Cl.
 *B81C 1/00*          (2006.01)
 *B81B 3/00*          (2006.01)
(52) U.S. Cl.
 CPC ........ *B81C 1/00182* (2013.01); *B81B 3/0032* (2013.01); *B81B 2201/0221* (2013.01);
 (Continued)
(58) Field of Classification Search
 CPC ........... B81C 1/00333; B81C 1/00182; B81C 2201/0109; B81C 2201/0132;
 (Continued)

(56) References Cited

U.S. PATENT DOCUMENTS

2004/0050161 A1*   3/2004  Lutz ...................... G01P 15/125
                                                      29/595
2005/0098840 A1*   5/2005  Fuertsch ................. B81B 3/007
                                                      438/48
(Continued)

OTHER PUBLICATIONS

Candler et al., "Long-Term and Accelerated Life Testing of a Novel Single-Wafer Vacuum Encapsulation for MEMS Resonators," *Journal of Microelectromechanical Systems*, Jan. 2007. (36 pages).
(Continued)

*Primary Examiner* — Moazzam Hossain
(74) *Attorney, Agent, or Firm* — Seed Intellectual Property Law Group LLP

(57)                  ABSTRACT

The present disclosure is directed to a process for manufacturing a micro-electro-mechanical system (MEMS) device. The process includes, in part, forming a first sacrificial dielectric region on a semiconductor wafer; forming a structural layer of semiconductor material on the first sacrificial dielectric region; forming a plurality of first openings through the structural layer; forming a second sacrificial dielectric region on the structural layer; forming a ceiling layer of semiconductor material on the second sacrificial dielectric region; forming a plurality of second openings through the ceiling layer; forming on the ceiling layer a permeable layer; selectively removing the first and the second sacrificial dielectric regions; and forming on the permeable layer a sealing layer of semiconductor material.

26 Claims, 16 Drawing Sheets

(52) U.S. Cl.
CPC ................. $B81B$ $2201/0235$ (2013.01); $B81B$ $2201/0242$ (2013.01); $B81B$ $2203/055$ (2013.01); $B81B$ $2207/115$ (2013.01); $B81C$ $2201/0109$ (2013.01); $B81C$ $2201/0132$ (2013.01); $B81C$ $2201/0176$ (2013.01)

(58) Field of Classification Search
CPC ........ B81C 2201/0176; B81C 1/00476; B81C 1/00444; B81C 1/00468; B81C 2201/0105; B81C 2201/107; B81C 2201/109; B81C 2201/0111; B81C 2201/0123; B81C 1/00158; B01D 67/0039
See application file for complete search history.

(56) References Cited

U.S. PATENT DOCUMENTS

2009/0267166 A1    10/2009  Verheijden et al.
2013/0214366 A1*    8/2013  Naito .................. B81C 1/00293
                                                              257/415
2017/0174507 A1*    6/2017  Chakravarty ....... B81C 1/00293
2020/0407214 A1*    12/2020  Renault .............. B81C 1/00349

OTHER PUBLICATIONS

Chen et al., "Robust Method of Fabricating Epitaxially Encapsulated MEMS Devices with Large Gaps," *Journal of Microelectromechanical Systems*, 26(6):1235-1243, Dec. 2017.

Kim et al., "Hermeticity and diffusion investigation in polysilicon film encapsulation for microelectromechanical systems," *Journal of Applied Physics*, 105(013514), 2009. (11 pages).

Kim et al., "Identification and Management of Diffusion Pathways in Polysilicon Encapsulation for MEMS Devices," *2008 IEEE 21st International Conference on Micro Electro Mechanical Systems*, Wuhan, China, Jan. 28, 2008, pp. 104-107.

Yang et al., "A Unified Epi-Seal Process for Fabrication of High-Stability Microelectromechanical Devices," *Journal of Microelectromechanical Systems*, 25(3):489-497, Jun. 2016.

* cited by examiner

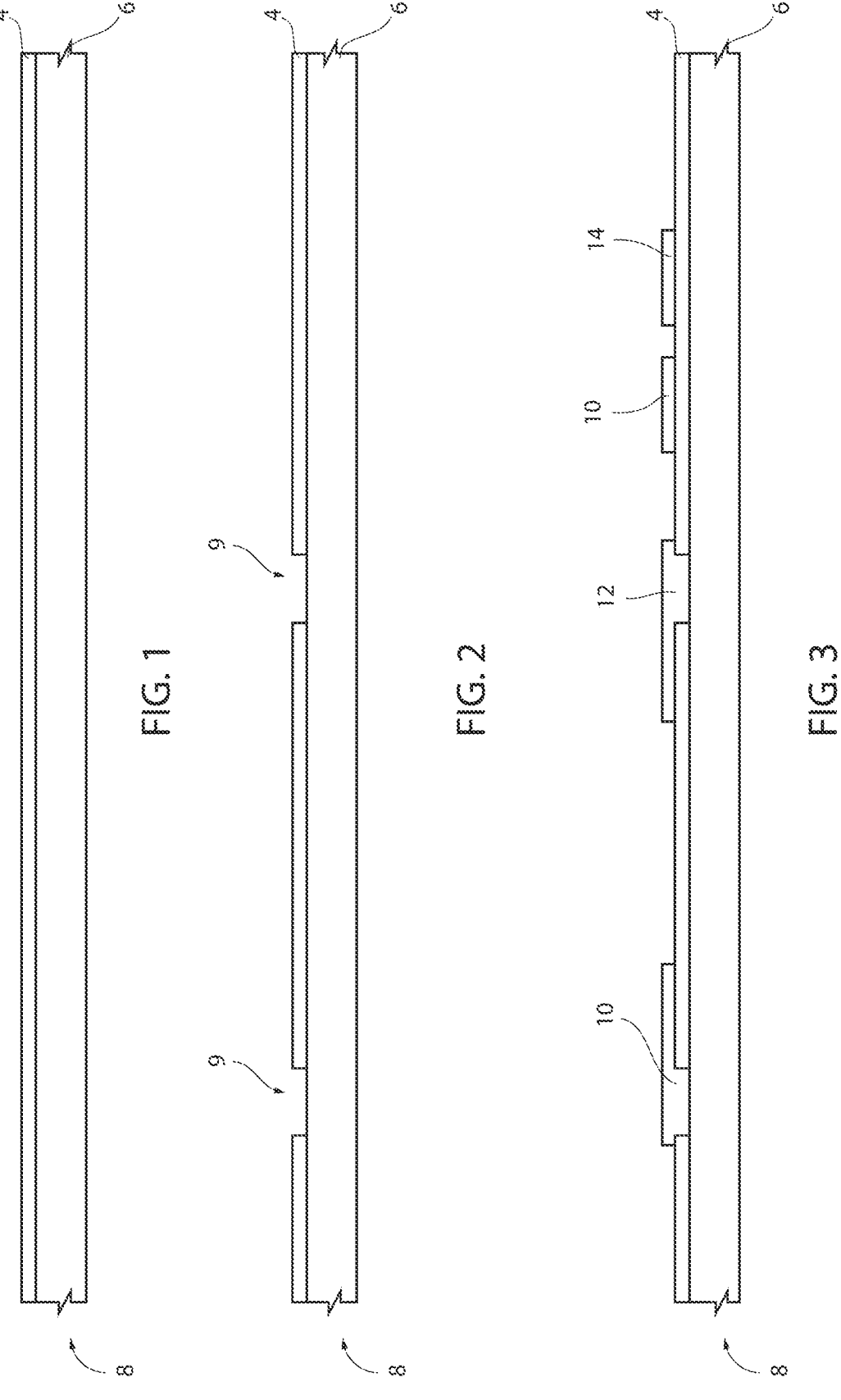

PROCESS FOR MANUFACTURING A MICRO-ELECTRO-MECHANICAL DEVICE FROM A SINGLE SEMICONDUCTOR WAFER AND RELATED MEMS DEVICE

BACKGROUND

Technical Field

The present disclosure relates to a process for manufacturing a MEMS (Micro-Electro-Mechanical System) device from a single semiconductor wafer, as well as to the related MEMS device.

Description of the Related Art

As is known, MEMS accelerometers are, for example, today available, which enable, for example, measurement of linear accelerations, inclinations and vibrations. These MEMS accelerometers generally comprise a vacuum cavity, isolated from the surrounding environment. The production of this cavity proves problematical. Typically, the cavity is formed by bonding together a cap wafer and a device wafer; for example, a glass frit bonding or a metal-bonding can be carried out, however, both of the solutions present some disadvantages, in addition to requiring the use of two patterned wafers.

In particular, both solutions are characterized by a low uniformity of the quality factor of the accelerometers produced, on account of the non-uniformity deriving from the process of bonding of the two wafers.

In addition, in the case of glass frit bonding, glass frit printing presents high tolerances, which entails a reduction of the useful area for the formation of the accelerometers. Furthermore, the cap wafer is patterned so as to accommodate deformation of the glass frit paste during bonding, with consequent increase in the final size of the accelerometers produced. Furthermore, the use of a lead paste is required, a material that is potentially dangerous for health.

In the case of metal bonding, it is necessary to pattern metal regions both on the cap wafer and on the device wafer, as well as to carry out cleaning steps before performing the bonding. Furthermore, the bonding is carried out at temperatures close to 400° C. and with high bonding forces, which may lead to chipping of the metal regions. In both cases, the production cost is high on account of the use of a second silicon wafer.

BRIEF SUMMARY

The present disclosure is directed to a solution that will overcome at least in part the drawbacks of the prior art.

According to the present disclosure a process for manufacturing a MEMS device and a resulting MEMS device are provided.

The process includes, in part, forming a first sacrificial dielectric region on a semiconductor wafer; forming a structural layer of semiconductor material on the first sacrificial dielectric region; forming a plurality of first openings through the structural layer; forming a second sacrificial dielectric region on the structural layer; forming a ceiling layer of semiconductor material on the second sacrificial dielectric region; forming a plurality of second openings through the ceiling layer; forming on the ceiling layer a permeable layer; selectively removing the first and the second sacrificial dielectric regions; and forming on the permeable layer a sealing layer of semiconductor material.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIGS. 1-17 are schematic cross-sectional illustrations of a wafer of semiconductor material during successive steps of the manufacturing process.

DETAILED DESCRIPTION

Figure 4:
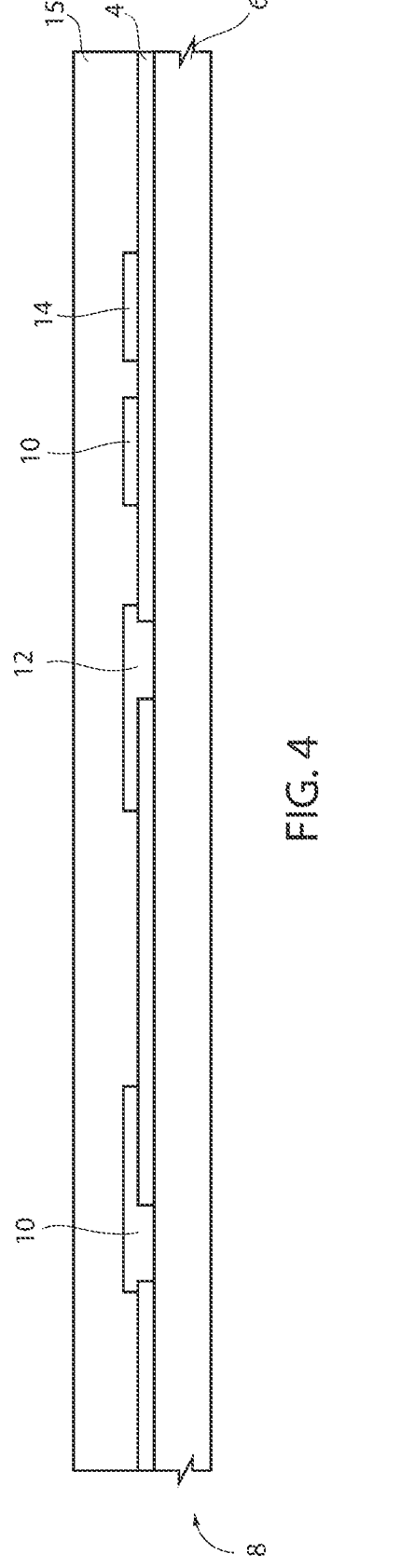

In the ensuing description, reference is made, purely by way of example, to the manufacture of a generic MEMS device, regardless of the type; for example, the MEMS device may be an accelerometer, a gyroscope, an inclinometer or an actuator. Furthermore, it is assumed, for example, that the MEMS device is of the type with control/detection of a capacitive type.

As illustrated in FIG. 1, the present process initially envisages forming an insulating region 4 on a substrate 6 of a semiconductor wafer 8; the substrate 6 is made of semiconductor material, such as, for example, silicon.

Albeit not illustrated, and in a per se known manner, the insulating region 4 may be made of subregions of different materials, such as, for example, a subregion of thermal oxide, arranged on the substrate 6, and an overlying subregion of thermally stabilised aluminium oxide. Furthermore, hereinafter the present description is limited to the evolution of a portion of the semiconductor wafer 8 that gives rise to a single MEMS device.

This having been said, as illustrated in FIG. 2, portions of the insulating region 4 are selectively removed so as to form recesses 9 that give out onto the underlying substrate 6. Stated differently, the recesses 9 extend to and expose the underlying substrate 6.

Next, as illustrated in FIG. 3, a conductive stator region 10 and a conductive rotor region 12 are formed on the insulating region 4, which are laterally staggered and extend, not only over the insulating region 4, but also within respective recesses 9 so as to contact corresponding portions of the substrate 6. Furthermore, an additional conductive region 14 is also formed, which extends over a corresponding portion of the insulating region 4, is separated from the substrate 6, and is laterally staggered with respect to the conductive stator region 10 and to the conductive rotor region 12.

Albeit not illustrated, the conductive stator region 10, the conductive rotor region 12, and the additional conductive region 14 may be formed, for example, by deposition, on the insulating region 4 and within the recesses 9, of a polysilicon layer with a high doping level (for example, of an N type), also known as polyrunner, and subsequent patterning such that the conductive stator region 10, the conductive rotor region 12, and the additional conductive region 14 are electrically separated from one another.

Furthermore, purely by way of example, FIG. 3 refers to the case in which the conductive stator region 10 has a closed and hollow shape, in top view, such as, for example, the shape of a frame or annulus, and surrounds, once again in top view, the conductive rotor region 12.

Then, as illustrated in FIG. 4, a first sacrificial region 15 is formed, on the insulating region 4, the conductive stator region 10, the conductive rotor region 12, and the additional conductive region 14. The first sacrificial region 15 is made of dielectric material, such as, for example, TEOS oxide.

Figure 5:
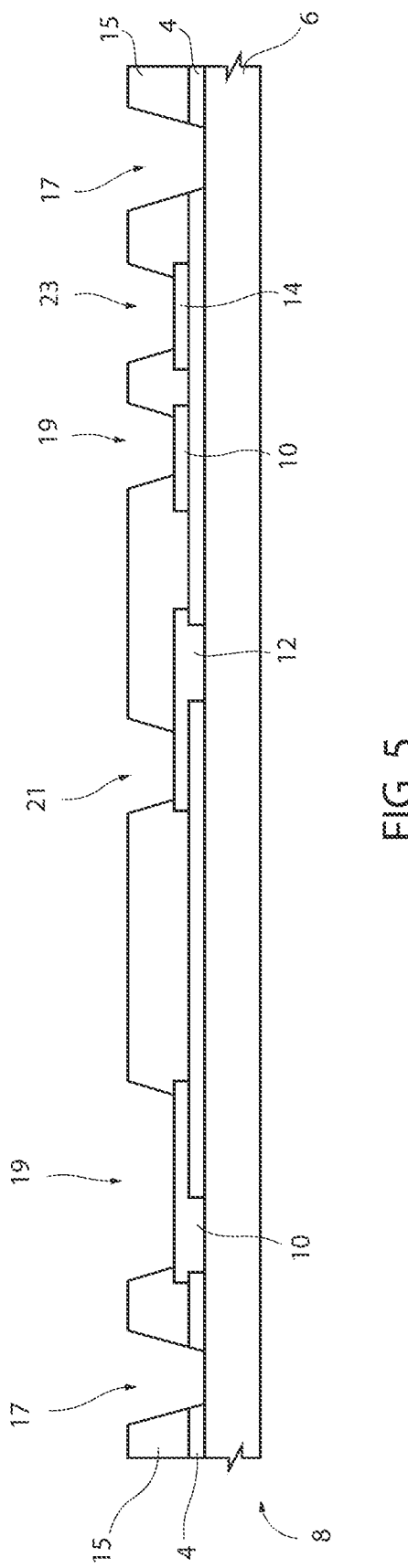

Next, as illustrated in FIG. 5, portions of the first sacrificial region 15 and of the insulating region 4 are selectively removed so as to form a trench 17, which has a closed profile, in top view, and extends through the first sacrificial region 15 and the insulating region 4 so as to be delimited at the bottom by a corresponding exposed portion of the substrate 6. Furthermore, portions of the first sacrificial region 15 are selectively removed so as to form a stator window 19, a rotor window 21, and a buttress window 23, which traverse the first sacrificial region 15 and give out, respectively, onto the conductive stator region 10, onto the conductive rotor region 12, and onto the additional conductive region 14 so as to expose corresponding portions of these regions.

In a per se known manner, the trench 17 may be formed by carrying out an etch different from the etch that leads to formation of the stator window 19, the rotor window 21, and the buttress window 23; i.e., two different masks may be used. The trench 17, the stator window 19, the rotor window 21, and the buttress window 23 form a sort of plurality of preliminary windows.

Figures 6, 7:
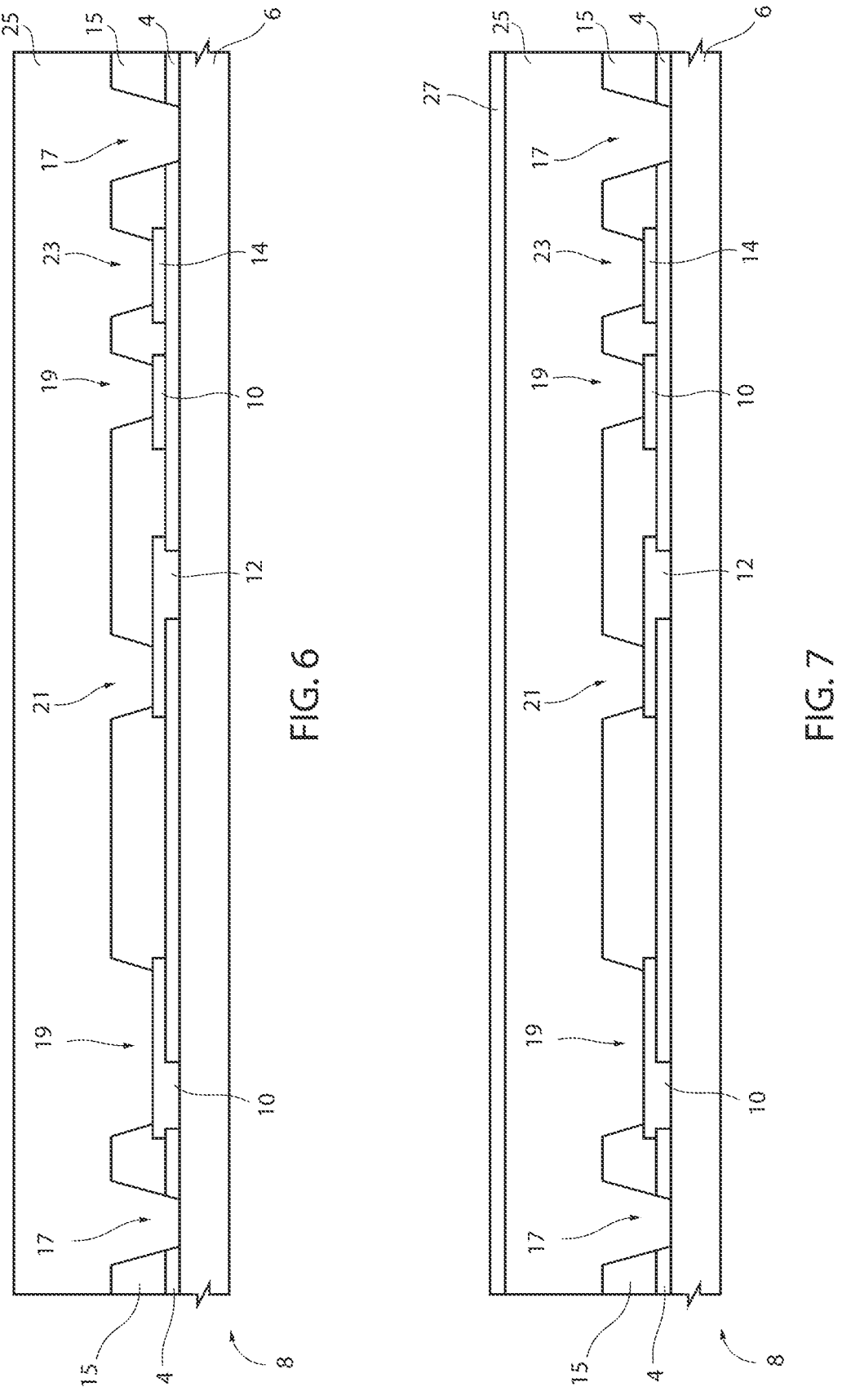

Then, as illustrated in FIG. 6, a first deposition of silicon is carried out so as to form a structural layer 25 of polycrystalline silicon, for example with a doping of an N type and having a thickness comprised, for example, between 15 μm and 60 μm.

In greater detail, the structural layer 25 extends, in direct contact, over the first sacrificial region 15, as well as within the trench 17, the stator window 19, the rotor window 21, and the buttress window 23 so as to contact the substrate 6, the conductive stator region 10, the conductive rotor region 12, and the additional conductive region 14. The structural layer 25 may also undergo chemical-mechanical planarization (CMP).

In practice, the structural layer 25 is formed on a base region of the semiconductor wafer 8, which includes the substrate 6, the insulating region 4, the conductive stator region 10, the conductive rotor region 12, the additional conductive region 14, and the first sacrificial region 15.

Figure 8:
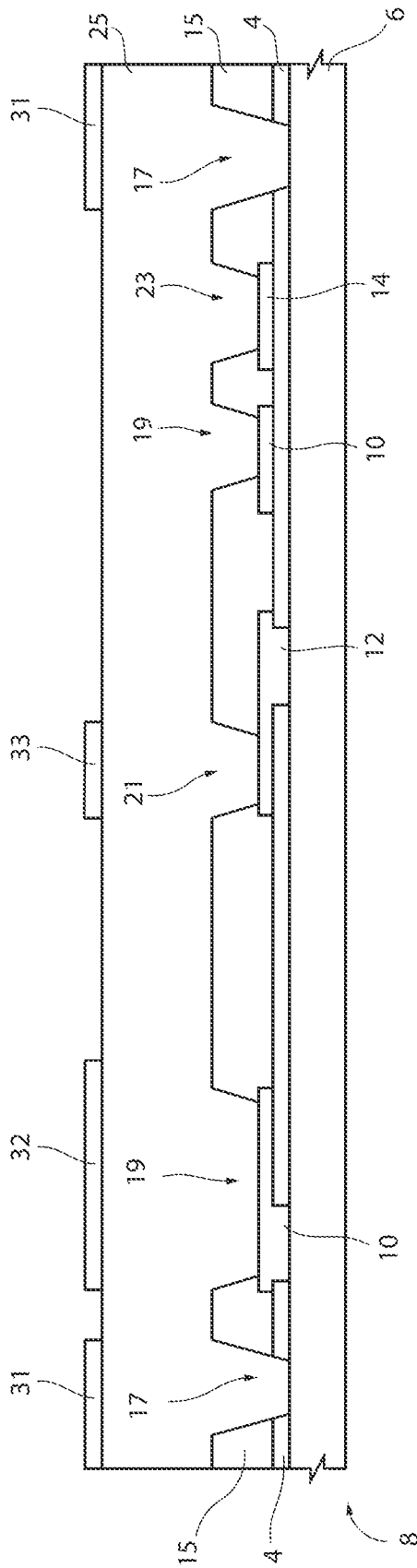

Then, as illustrated in FIG. 7, formed on the structural layer 25 is an insulating layer 27, formed, for example, of silicon nitride (SiN), which, as illustrated in FIG. 8, is then patterned so as to form a first, a second and a third electrical-decoupling region 31, 32, 33, laterally staggered with respect to one another.

For example, the first electrical-decoupling region 31 overlies, at a distance, the trench 17. The second and the third electrical-decoupling regions 32, 33 overlie, at a distance, a part of the stator window 19 and the rotor window 21, respectively. The first, the second and the third electrical-decoupling regions 31, 32, 33 are laterally staggered with respect to the buttress window 23.

Figure 9:
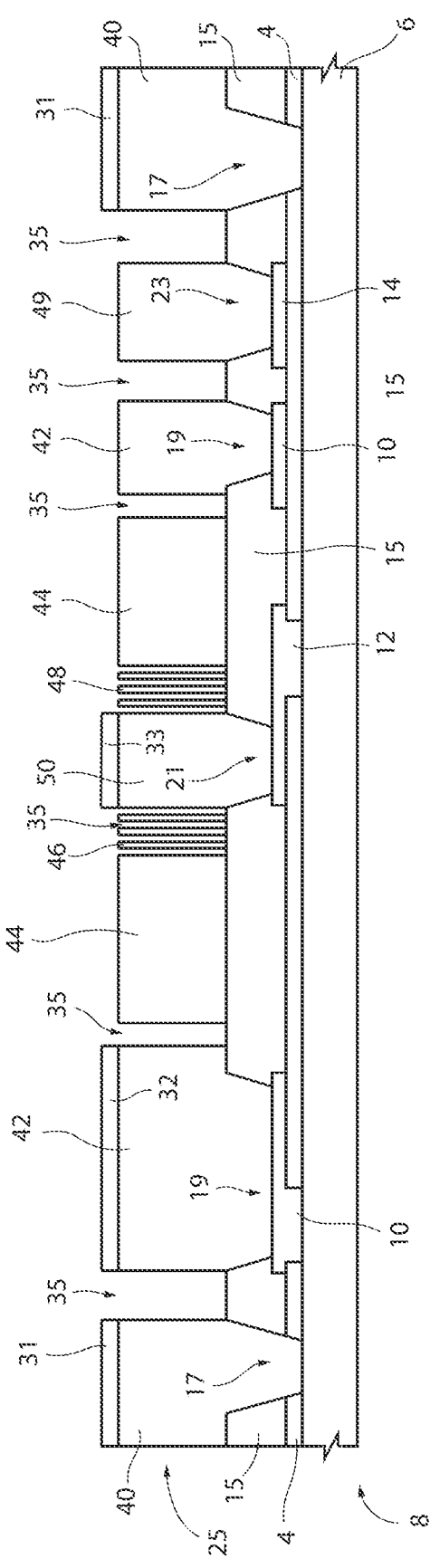

Next, by using a mask (not illustrated), portions of the structural layer 25 laterally staggered with respect to the first, the second and the third electrical-decoupling regions 31, 32, 33 are selectively removed, as illustrated in FIG. 9 so as to form a plurality of first openings 35. In practice, the first openings 35 extend through the structural layer 25 (e.g., are through holes) and are delimited at the bottom by corresponding portions of the first sacrificial region 15.

Furthermore, for reasons that will be clarified hereinafter, the first openings 35 may have a so-called critical dimension (CD); for example, this will not exceed 4 μm.

In greater detail, the first openings 35 laterally delimit portions of the structural layer 25 that form, respectively, a perimetral region 40, a fixed stator region 42, a mobile mass 44, a first and a second spring 46, 48, a preliminary buttress region 49, and a pillar region 50.

In particular, the fixed stator region 42 extends in the stator window 19 and overlies, in direct contact, the conductive stator region 10. Furthermore, the fixed stator region 42 laterally surrounds the mobile mass 44, the first and the second springs 46, 48, and the pillar region 50. Part of the fixed stator region 42 is overlaid by the second electrical-decoupling region 32.

The mobile mass 44 is laterally staggered with respect to the first, the second and the third electrical-decoupling regions 31, 32, 33; therefore, it is exposed at the top. Furthermore, the mobile mass 44 overlies a portion of the first sacrificial region 15 and, albeit not illustrated, has a hollow shape (for example, it has the shape of a rectangular frame or annulus, in top view) so as to surround laterally the pillar region 50.

In greater detail, the pillar region 50 extends underneath the third electrical-decoupling region 33. Furthermore, the pillar region 50 extends within the rotor window 21 so as to contact the conductive rotor region 12. The mobile mass 44 is mechanically coupled to the pillar region 50 by the first and the second springs 46, 48, each of which is interposed between the mobile mass 44 and the pillar region 50. For example, in resting conditions, the first and the second springs 46, 48 are arranged in a symmetrical way with respect to the pillar region 50.

In greater detail, the first and the second springs 46, 48 are laterally staggered with respect to the first, the second and the third electrical-decoupling regions 31, 32, 33, and are therefore exposed at the top. In addition, the first and the second springs 46, 48 overlie, in direct contact, the first sacrificial region 15. Once released, the first and the second springs 46, 48 are deformable so as to enable the mobile mass 44 to translate in a plane parallel to the main surface of the substrate 6 of the semiconductor wafer 8, as explained hereinafter.

The perimetral region 40 extends underneath the first electrical-decoupling region 31. Furthermore, the perimetral region 40 extends in the trench 17 so as to contact the substrate 6. Furthermore, the perimetral region 40 laterally surrounds the fixed stator region 42 and the preliminary buttress region 49.

The preliminary buttress region 49 is laterally staggered with respect to the first, the second and the third electrical-decoupling regions 31, 32, 33, and is therefore exposed at the top. Furthermore, the preliminary buttress region 49 extends in the buttress window 23 so as to contact the additional conductive region 14. In addition, the preliminary buttress region 49 is interposed, at a distance, between the fixed stator region 42 and the perimetral region 40.

Figure 10:
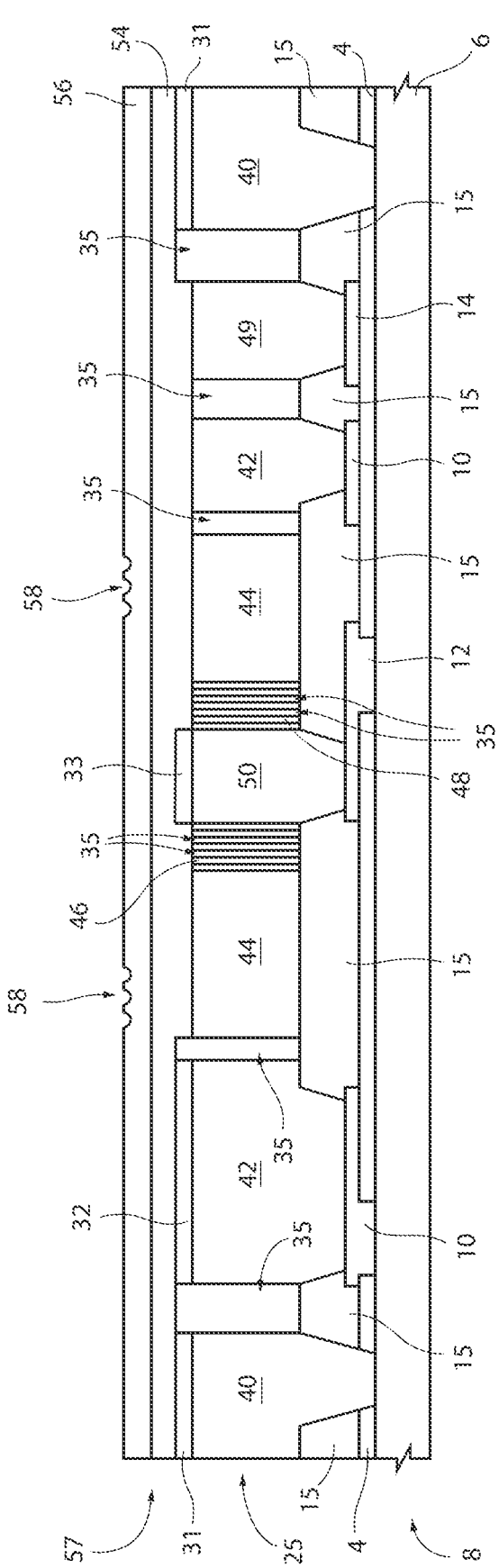

Next, as illustrated in FIG. 10, a first dielectric covering region 54 is formed, which is formed, for example, by performing one or more depositions of oxide (for example, silicon oxide obtained by TEOS-based chemical vapour deposition, CVD) followed by CMP. In this way, the first dielectric covering region 54 overlies, in direct contact, the first, the second and the third electrical-decoupling regions 31, 32, 33, as well as the exposed portions of the structural layer 25, and therefore the exposed part of the fixed stator region 42, the mobile mass 44, the first and the second springs 46, 48 and the preliminary buttress region 49. In addition, the first dielectric covering region 54 closes the first openings 35 at the top, for example without filling them completely. Stated differently, the first dielectric covering region 54 extends over and covers the first openings 35.

Moreover, as illustrated once again in FIG. 10, a second dielectric covering region 56 is formed on the first dielectric covering region 54, for example by deposition of oxide (for example, silicon oxide obtained from TEOS-based CVD). In this connection, even though in FIG. 10 the first and the second dielectric covering regions 54, 56 are illustrated as distinct, they may be made of a same material so as to form a single second sacrificial region 57. In this connection, in the subsequent figures, the second sacrificial region 57 will be shown as a whole.

Furthermore, the second dielectric covering region 56 is machined (for example, by execution of a selective timed etch of a dry type) so as to form the surface grooves 58.

Figure 11:
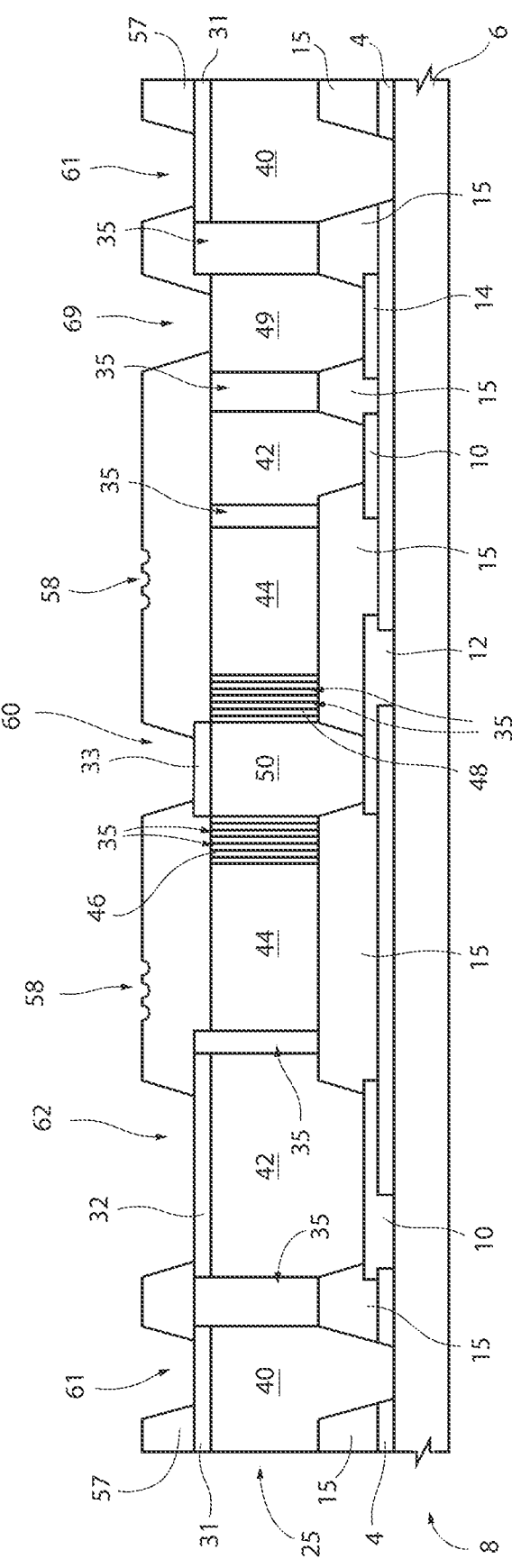

Next, as illustrated in FIG. 11, portions of the second sacrificial region 57 are selectively removed so as to form an anchorage rotor window 60, a perimetral anchorage window 61, an anchorage stator window 62, and an anchorage buttress window 69.

In particular, the perimetral anchorage window 61 traverses the second sacrificial region 57 and gives out onto the first electrical-decoupling region 31.

The anchorage stator window 62 traverses the second sacrificial region 57 and gives out onto the second electrical-decoupling region 32.

The anchorage rotor window 60 traverses the second sacrificial region 57 and gives out onto the third electrical-decoupling region 33.

The anchorage buttress window 69 traverses the second sacrificial region 57 and gives out onto the preliminary buttress region 49.

The anchorage buttress window 69, the anchorage rotor window 60, the perimetral anchorage window 61, and the anchorage stator window 62 may be formed during a same etching operation, thus using a single mask.

Figure 12:
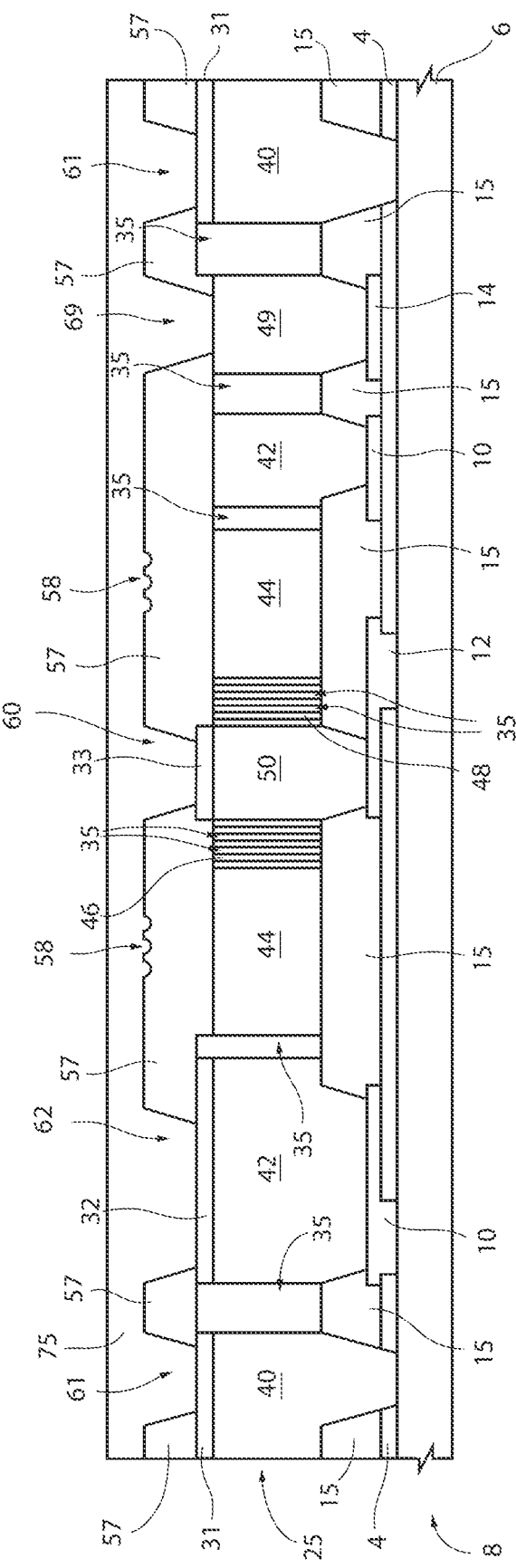

Next, as illustrated in FIG. 12, a second deposition of silicon is performed so as to form a ceiling layer 75 of polycrystalline silicon, for example, with a doping of an N type and having a thickness comprised, for example, between 5 µm and 10 µm. A subsequent planarization of the ceiling layer 75 is also carried out.

In greater detail, the ceiling layer 75 extends, in direct contact, over the second sacrificial region 57. Furthermore, portions of the ceiling layer 75 extend respectively within the anchorage rotor window 60, the perimetral anchorage window 61, the anchorage stator window 62, and the anchorage buttress window 69 so as to contact the first, the second and the third electrical-decoupling regions 31, 32, 33, as well as the preliminary buttress region 49. In this connection, the ceiling layer 75 forms, with the preliminary buttress region 49, a single semiconductor region (for reasons of clarity, in FIG. 12 and in the subsequent figures the line of demarcation between the ceiling layer 75 and the preliminary buttress region 49 is in any case maintained). In addition, the ceiling layer 75 fills the grooves 58.

Figure 13:
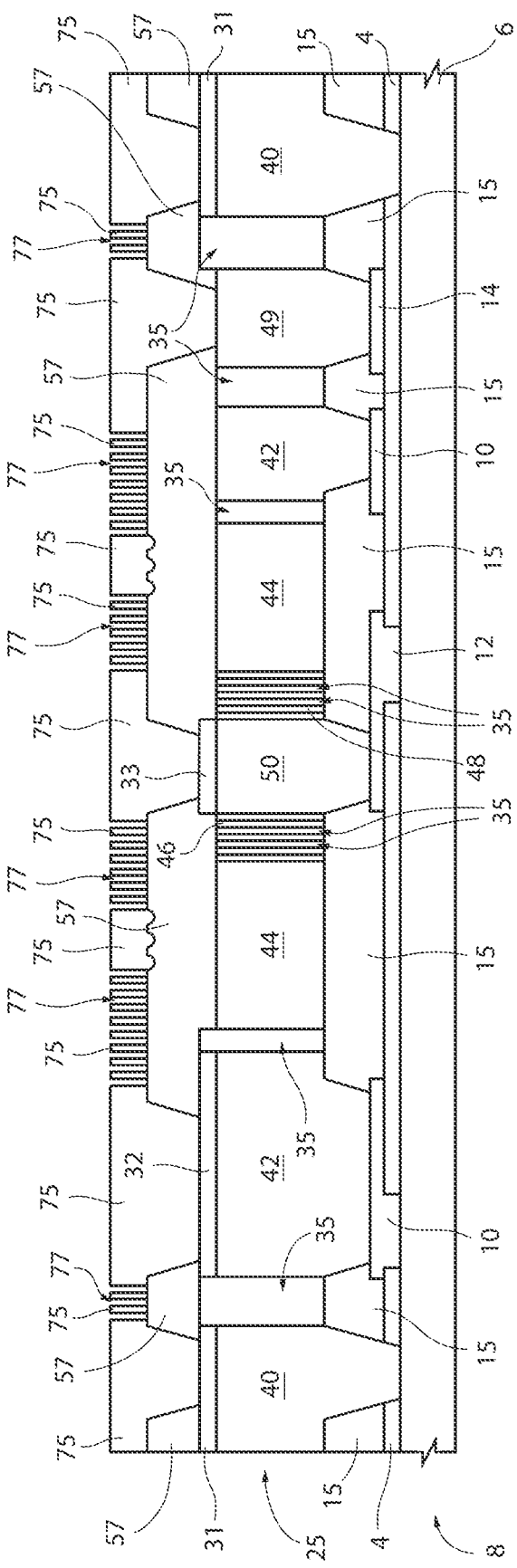

Then, as illustrated in FIG. 13, portions of the ceiling layer 75 are selectively removed by carrying out a dry etch so as to form a plurality of second openings 77, which give out onto corresponding portions of the second sacrificial region 57. The second openings 77 may have a critical dimension, for example, not exceeding 1 µm.

Figure 14:
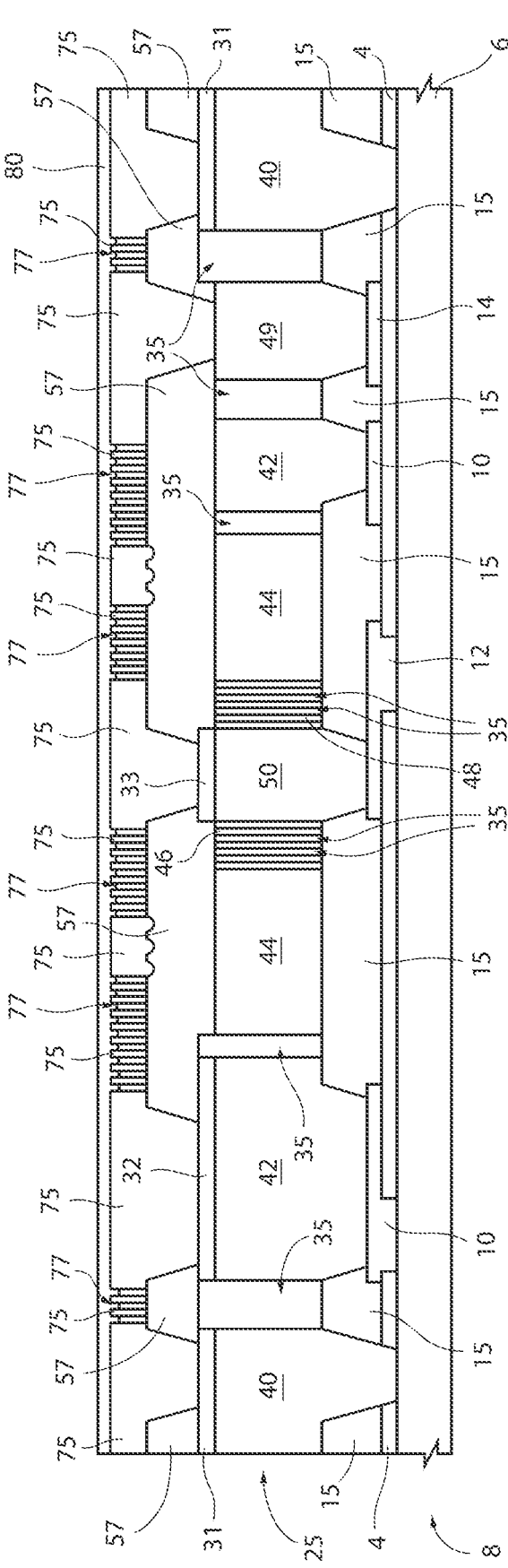

Next, as illustrated in FIG. 14, a layer 80 of polysilicon permeable to hydrofluoric acid (HF) is deposited on the ceiling layer 75; hereinafter the layer 80 is referred to as the permeable layer 80. The permeable layer 80 closes the second openings 77 at the top, for example without filling them completely.

In greater detail, the permeable layer 80 has a thickness comprised, for example, between 70 nm and 200 nm and is formed by low pressure chemical vapour deposition (LPCVD), using silane ($SiH_4$) as precursor, with a pressure comprised, for example, between 100 mTorr and 1000 mTorr and with a temperature comprised, for example, between 580° C. and 640° C. In this way, the permeable layer 80 has a porous structure, permeable to gaseous hydrofluoric acid.

Figure 15:
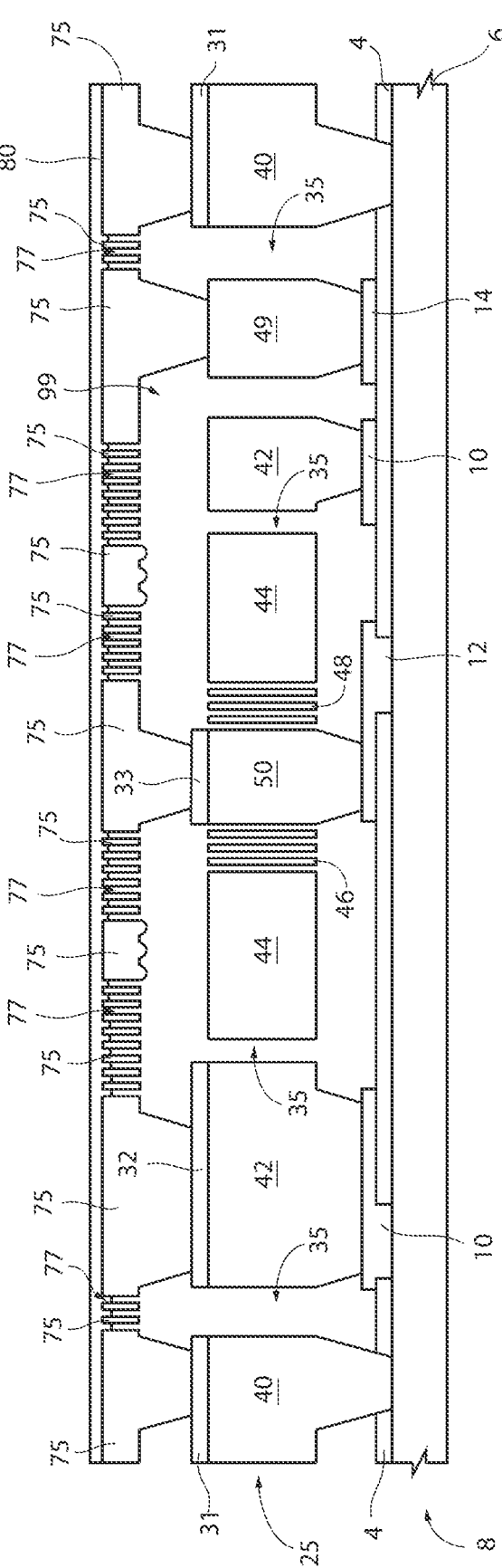

Then, the first and the second sacrificial regions 15, 57 are selectively removed, thus causing the hydrofluoric acid in the gaseous phase to flow through the permeable layer 80 and the second openings 77. In particular, after causing the removal of the second sacrificial region 57, the hydrofluoric acid traverses the first openings 35 and causes removal of the first sacrificial region 15. In this way, as illustrated in FIG. 15, there occurs release of the mobile mass 44 and of the first and the second springs 46, 48.

In practice, the hydrofluoric acid etches the dielectric material that forms the first and the second sacrificial regions 15, 57, but substantially does not etch the polysilicon, nor the insulating region 4. In particular, the insulating region 4 is not etched by the hydrofluoric acid thanks to the presence of the thermally stabilised aluminium oxide. Furthermore, the hydrofluoric acid does not etch the silicon nitride that forms the first, the second and the third electrical-decoupling regions 31, 32, 33.

The spaces previously occupied by the first and the second sacrificial regions 15, 57 form, together with the first openings 35, a cavity 99, which is laterally delimited by the perimetral region 40, the first electrical-decoupling region 31, and the portion of the ceiling layer 75 that contacts the latter. The first electrical-decoupling region 31 enables electrical insulation of the perimetral region 40 from the ceiling layer 75.

The cavity 99 is also delimited at the top by the ceiling layer 75 and is in fluidic communication with the overlying second openings 77. The cavity 99 is also delimited at the bottom by the insulating region 4.

Extending within the cavity 99 are the fixed stator region 42, the mobile mass 44, the first and the second springs 46, 48, the preliminary buttress region 49, and the pillar region 50.

In particular, the mobile mass 44 and the first and the second springs 46, 48 are suspended within the cavity 99. The parts of the ceiling layer 75 that previously occupied the grooves 58 function as so-called Z stoppers for the mobile mass 44.

As previously explained, at least part of the fixed stator region 42 is fixed to the ceiling layer 75 by interposition of the first electrical-decoupling region 31; the pillar region 50 is fixed to the ceiling layer 75 by interposition of the third electrical-decoupling region 33. The fixed stator region 42 and the pillar region 50 are in any case electrically insulated from the ceiling layer 75.

Figure 16:
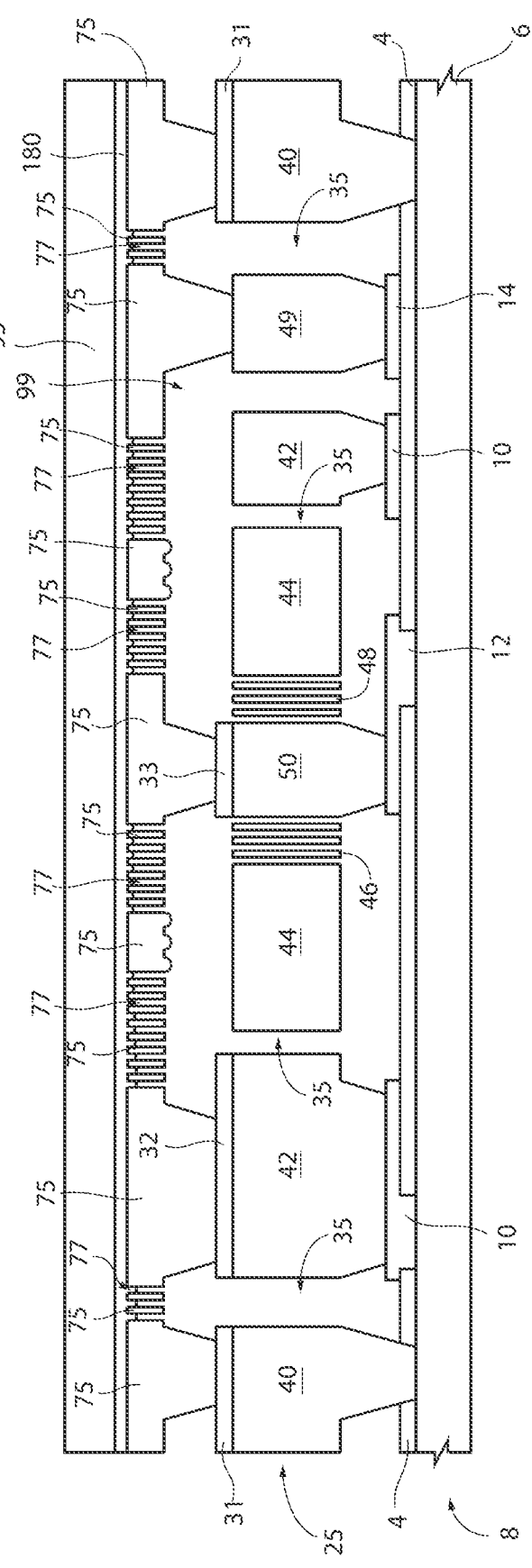

Then, as illustrated in FIG. 16, a third deposition of silicon is carried out so as to form, on the permeable layer 80, a sealing layer 95 of polycrystalline silicon, for example having a doping of an N type and having a thickness comprised, for example, between 2 µm and 50 µm. The sealing layer 95 may also undergo planarization.

In detail, the sealing layer 95 may be formed by deposition in an environment at a controlled pressure (for example, comprised between 0.1 bar and 1 bar) and with a temperature comprised between 800° C. and 1200° C. Furthermore, optionally a process of degassing may be carried out in order to enable the hydrogen present in the cavity 99 to diffuse through the sealing layer 95 so as to cause the cavity 99 to be approximately in vacuum conditions or in any case to present a desired pressure therein.

In greater detail, the deposition process of the sealing layer 95 also causes a variation of permeability of the permeable layer 80. In particular, the previously porous structure of the permeable layer 80 undergoes filling, such that the permeable layer 80 loses the previous characteristic of permeability and assumes a crystalline structure approximately similar to that of the sealing layer 95 and to that of the ceiling layer 75, but with grains on average smaller than the grains of the crystalline structures of the sealing layer 95 and of the ceiling layer 75. For this reason, from FIG. 16 onwards, the permeable layer 80 as transformed following upon formation of the sealing layer 95 is referred to as the transformed layer 180.

From a crystallographic standpoint, an interface, i.e., a discontinuity in the crystalline structure, is therefore present between the transformed layer 180 and the sealing layer 95. Similarly, another interface is present between the transformed layer 180 and the ceiling layer 75.

In practice, the sealing layer 95 and the transformed layer 180 provide hermetic sealing of the second openings 77; i.e., they seal at the top the ensemble formed by the cavity 99 and the second openings 77, which is moreover hermetically closed thanks to the mechanical coupling present between the ceiling layer 75 and the perimetral region 40, as well as thanks to the mechanical coupling present between the perimetral region 40 and the substrate 6.

Moreover, the preliminary buttress region 49 forms, together with the overlying portion of the ceiling layer 75, a buttress structure, which has the function of locally propping the ensemble formed by the ceiling layer 75, the transformed layer 180 and the sealing layer 95 so as to increase the stiffness thereof in order to prevent deformation (for example, bending) thereof. The arrangement and shape of the buttress structure may be optimised, for example according to the arrangement and shape of the fixed stator region 42, the mobile mass 44 and the pillar region 50.

Next, the manufacturing process envisages two possible variants.

Figure 17:
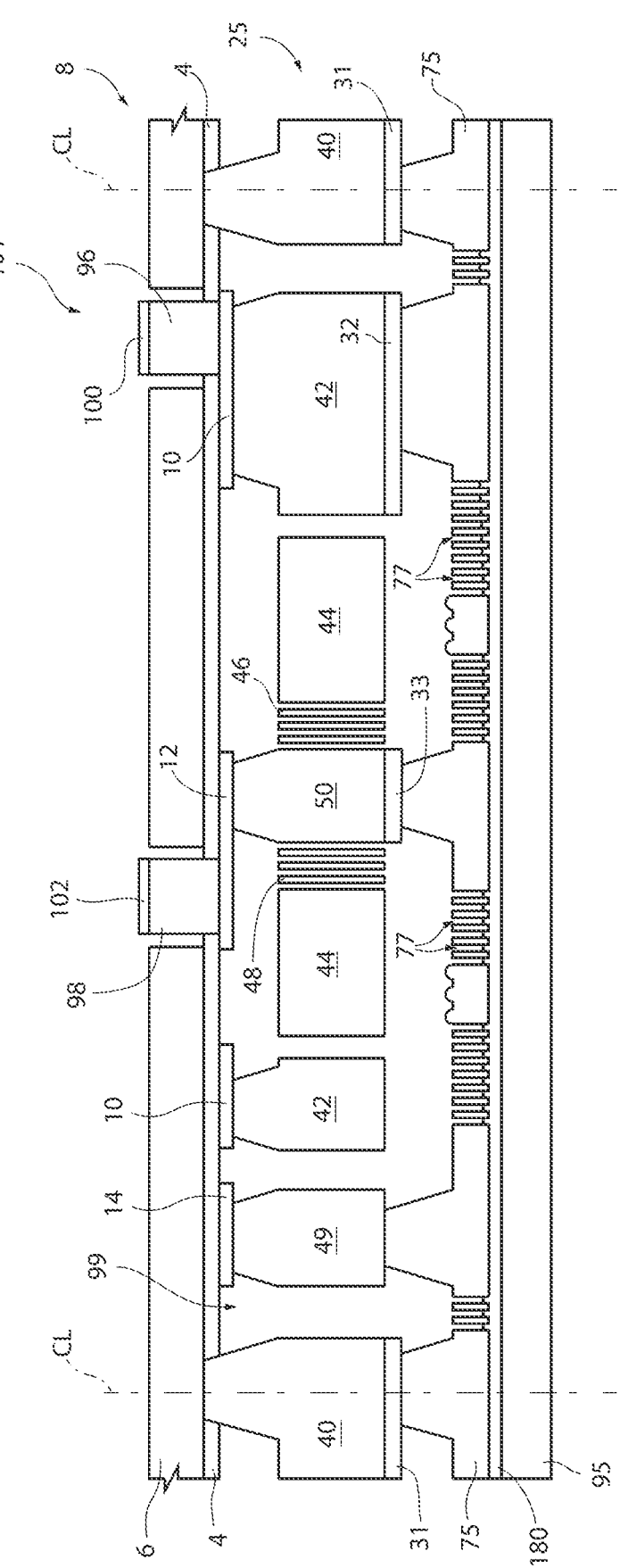

According to a first variant, illustrated in FIG. 17, the semiconductor wafer 8 is flipped over and the substrate 6 is then machined so as to form at least a first and a second through silicon via 96, 98; furthermore, a stator metallization 100 and a rotor metallization 102 are formed, these metallizations being arranged on the main surface of the substrate 6 opposite to the insulating region 4. Furthermore, the first through silicon via 96 electrically connects the stator metallization 100 to the conductive stator region 10, while the second through silicon via 98 electrically connects the rotor metallization 102 to the conductive rotor region 12.

Then, the manufacturing process may proceed in a per se known manner, for example, by forming further passivation regions and contact pads (not illustrated). Furthermore, a process of dicing of the semiconductor wafer 8 is then carried out, for example, along scribe lines CL that traverse the perimetral region 40 (illustrated in FIG. 17) so as to singulate a plurality of MEMS devices (one of which is illustrated in FIG. 17, where it is designated by 101).

Figure 18:
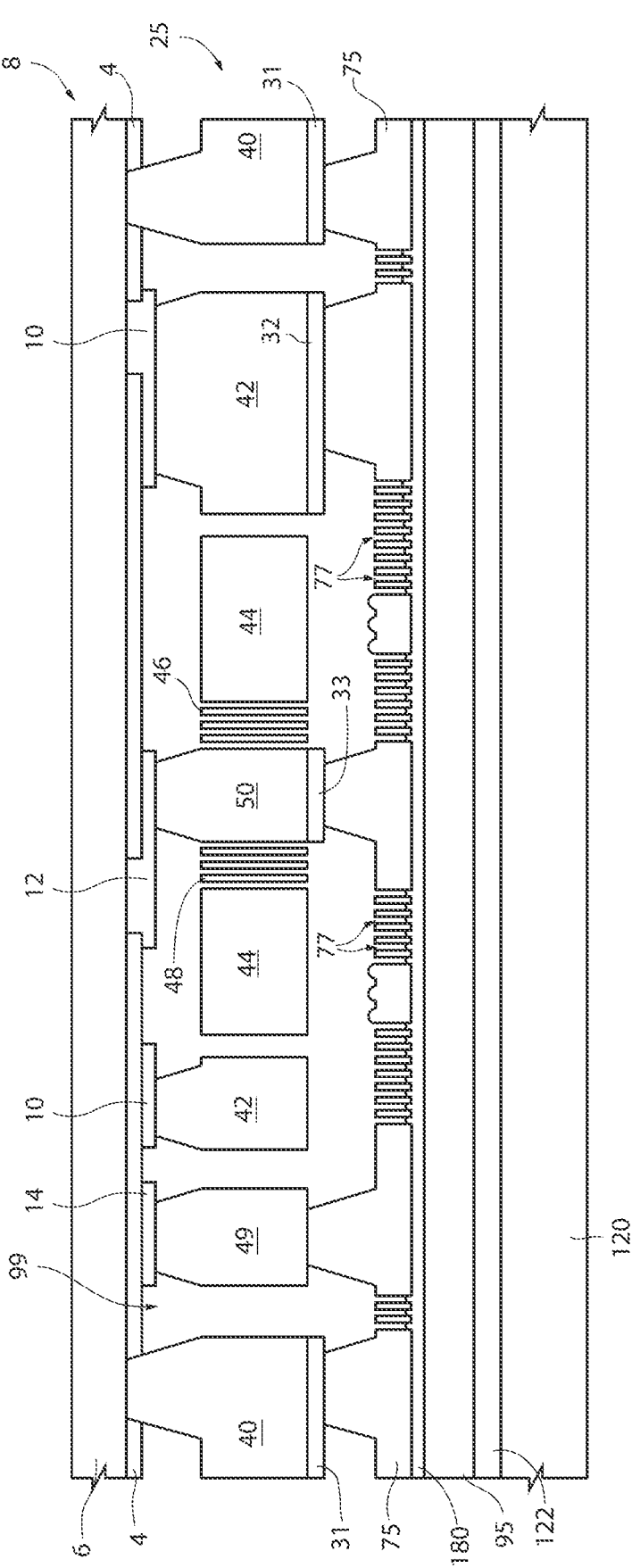
FIGS. 18-20 are schematic cross-sectional illustrations of a wafer of semiconductor material during successive steps of a variant of the manufacturing process.

According to a second variant, illustrated in FIG. 18, the semiconductor wafer 8, after being flipped over, is temporarily bonded to a supporting wafer 120, by using an adhesive layer 122, which is interposed between the sealing layer 95 and the supporting wafer 120.

Figure 19:
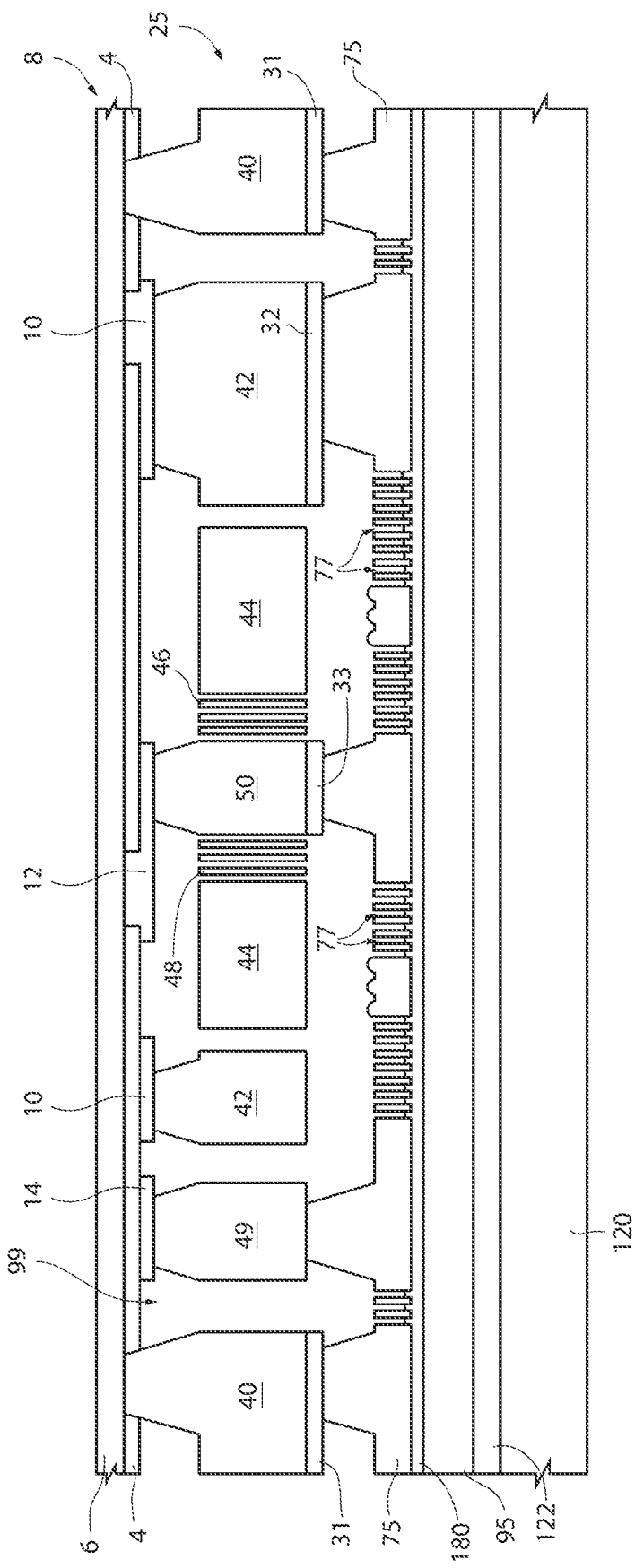

Then, as illustrated in FIG. 19, the thickness of the substrate 6 is reduced by a so-called lapping and polishing process.

Figure 20:
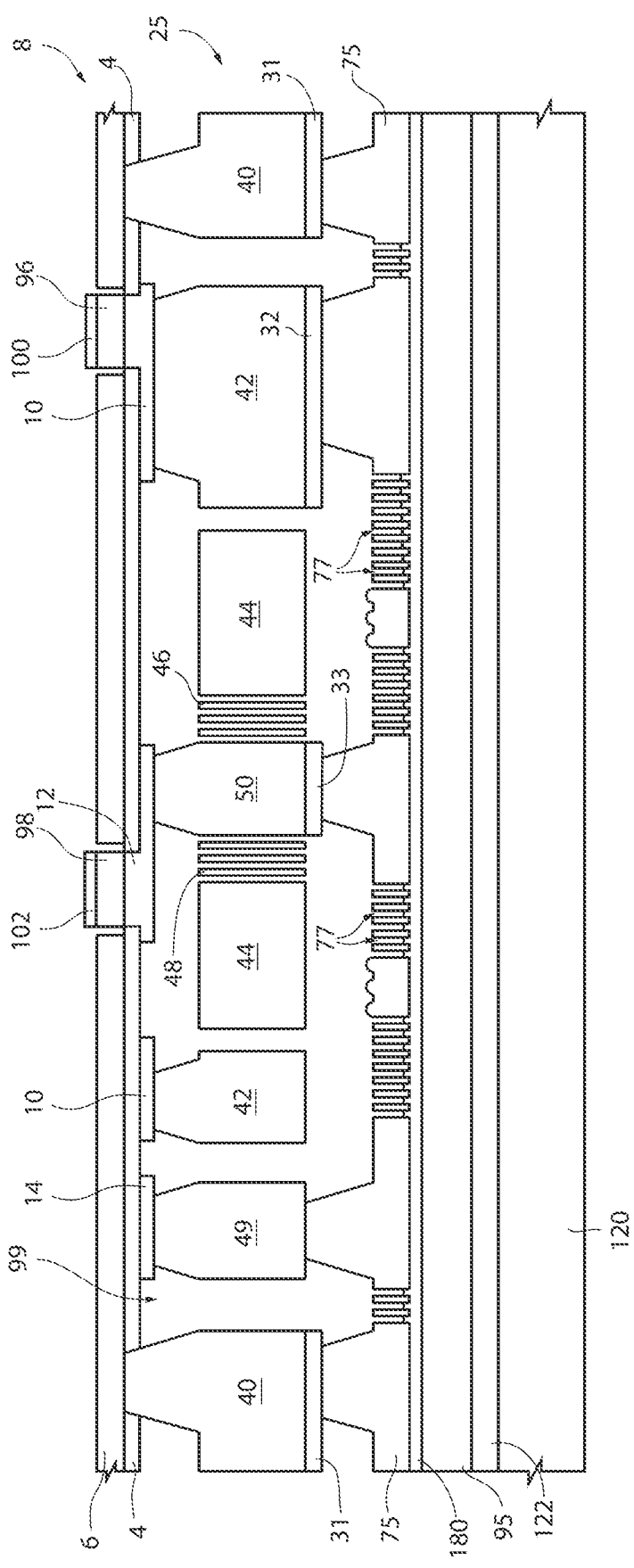

Next, as illustrated in FIG. 20, the first and the second through silicon vias 96, 98 are formed after the stator metallization 100 and the rotor metallization 102 have been formed. Then, the manufacturing process proceeds in the same way as described with reference to the first variant.

For practical purposes, this second variant enables MEMS devices to be obtained having a further reduced final thickness (for example, less than 300 μm) as compared to what can be obtained with the first variant.

The advantages that the present solution affords emerge clearly from the foregoing description.

In particular, the present solution enables reduction of the manufacturing costs, since it envisages the use of a single wafer. Furthermore, the present solution enables reduction of the dimensions (in particular, the thickness) of the MEMS device.

In addition, the present solution affords a better uniformity of the quality factor of the MEMS devices produced since it does not entail implementation of a wafer-bonding process.

The present solution also does not entail the use of lead-containing compounds, such as, for example, glass frit paste.

Finally, it is clear that modifications and variations may be made to the manufacturing process and to the MEMS device described and illustrated here, without thereby departing from the scope of the present disclosure.

For example, the MEMS device may be of the type with control/detection of a non-capacitive type (for example, piezoelectric). In general, while the present description has focused on a MEMS device in which the functional elements (understood as mobile and/or deformable elements) comprise the mobile mass 44 and the first and the second springs 46, 48, it is possible for the MEMS device to have a different type of functional elements (for example, cantilever elements), mobile within the cavity 99, which may again be hermetically closed. It is thus possible that, instead of the fixed stator region 42 and the pillar region 50, which functions as fixed rotor region, semiconductor regions are present that function, for example, as anode and cathode.

Removal of the first and the second sacrificial regions 15, 57 may be partial.

The buttress structure, and therefore the preliminary buttress structure 49, may be absent, as likewise the additional conductive region 14.

It is also possible for additional operations to be carried out, such as, for example, the creation of the so-called ground contacts.

Finally, it is possible to use different materials. In particular, it is possible to use semiconductors different from silicon/polysilicon.

A process for manufacturing a MEMS device (101) may be summarized as including forming a first sacrificial dielectric region (15) on a semiconductor wafer (4,6,10,12,14); forming a structural layer (25) of semiconductor material on the first sacrificial dielectric region (15); forming a plurality of first openings (35) through the structural layer (25), which laterally delimit at least one functional element (44,46,48) and give out onto the first sacrificial dielectric region (15); forming a second sacrificial dielectric region (57) on the structural layer (25) so as to close the first openings (35); forming a ceiling layer (75) of semiconductor material on the second sacrificial dielectric region (57); forming a plurality of second openings (77) through the ceiling layer (75), which give out onto the second sacrificial dielectric region (57); forming on the ceiling layer (77) a permeable layer (80), which closes the second openings (77); selectively removing the first and the second sacrificial dielectric regions (15, 57) by causing a gas to flow through the permeable layer (80), so as to release the functional element (44,46,48); and then forming on the permeable layer (80) a sealing layer (75) of semiconductor material.

The manufacturing process may further include, before forming the ceiling layer (75), forming a plurality of anchorage windows (60, 61, 62, 69) through the second sacrificial dielectric region (57); and wherein said ceiling layer (75) extends within the anchorage windows (60, 61, 62, 69).

The manufacturing process may further include forming on the structural layer (25) a number of electrical-decoupling regions (31, 32, 33) of dielectric material, the first openings (35) being laterally staggered with respect to the electrical-decoupling regions (31, 32, 33); and wherein the second sacrificial dielectric region (57) extends on the structural layer (25) and on the electrical-decoupling regions (31,32,33); and wherein at least one first anchorage window (60, 61, 62) gives out onto a portion of a corresponding electrical-decoupling region (31, 32, 33), the portion of the ceiling layer (75) that extends within said first anchorage window (60, 61, 62) contacting said portion of a corresponding electrical-decoupling region (31, 32, 33); and wherein at least one second anchorage window (69) is laterally staggered with respect to the electrical-decoupling regions (31, 32, 33) and gives out onto the structural layer (25), the portion of the ceiling layer (75) that extends in said second anchorage window (69) contacting a corresponding portion (49) of the structural layer (25), with which it forms a buttress structure (49,75) laterally staggered with respect to the functional element (44,46,48).

The manufacturing process may further include before forming the structural layer (25), forming a plurality of preliminary windows (19, 21, 23) through the first sacrificial dielectric region (15); and wherein the structural layer (25) extends within the preliminary windows (17, 19, 21, 23).

The semiconductor wafer (8) may include a semiconductor substrate (6); an insulating region (4), which is arranged on the semiconductor substrate (6) and is traversed by a number of recesses (9) that give out onto the semiconductor substrate (6); a plurality of conductive regions (10,12,14) separated from one another, which extend on the insulating region (4) and within the recesses (9); and wherein each preliminary window (17, 19, 21, 23) gives out alternatively onto a corresponding conductive region (10,12,14) or onto the semiconductor substrate (6).

The manufacturing process may further include forming a number of contacts (100,102) on the semiconductor substrate (6), on a side opposite to the insulating region (4); and electrically connecting said contacts (100,102) to corresponding conductive regions (10,12).

The manufacturing process may further include, before forming the contacts (100,102), arranging the semiconductor wafer (8) on a temporary support (120); and reducing the thickness of the semiconductor substrate (6).

Selective removal of the first and the second sacrificial dielectric regions (15,57) may cause formation of a cavity (99), which is in fluidic communication with the second openings (77); and wherein the functional element (44,46, 48) may be suspended in the cavity (99).

The cavity (99) may be hermetically closed.

The structural layer (25), the ceiling layer (77), the permeable layer (80), and the sealing layer (95) may be made of polysilicon.

The gas may be hydrofluoric acid.

The insulating region (4) may be formed at least in part of aluminium oxide.

A MEMS device (30) may be summarized as including a base region (4, 6, 10, 12, 14) including a semiconductor substrate (6); a structural layer (25) of semiconductor material, arranged on the base region (4, 6, 10, 12, 14) and traversed by a plurality of first openings (35), which laterally delimit at least one functional element (44, 46, 48); a ceiling layer (75) of semiconductor material, arranged on the structural layer (25) and traversed by a plurality of second openings (77); a transformed layer (180), which is arranged on the ceiling layer (77) and closes the second openings (77); and a sealing layer (75) of semiconductor material, arranged on the transformed layer (180).

The transformed layer (180) may be of polysilicon.

The ceiling layer (75) and the sealing layer (95) may be made of polysilicon and may have crystalline structures with grains on average larger than the grains of the crystalline structure of the transformed layer (180).

The structural layer (25) may be made of polysilicon.

The base region (4, 6, 10, 12, 14), the structural layer (25), and the ceiling layer (75) may delimit a cavity (99), which is in fluidic communication with the second openings (77); and the functional element (44, 46, 48) may be suspended in the cavity (99).

The base region (4, 6, 10, 12, 14) may further include an insulating region (4), which is arranged on the semiconductor substrate (6) and is traversed by a number of recesses (9) that give out onto the semiconductor substrate (6); and a plurality of conductive regions (10, 12, 14) separated from one another, which extend on the insulating region (4) and within the recesses (9); and wherein the structural layer (25) contacts the semiconductor substrate (6) and the conductive regions (10,12,14).

The MEMS device may further include a number of contacts (100,102) arranged on the semiconductor substrate (6), on a side opposite to the insulating region (4), said contacts (100,102) being electrically connected to corresponding conductive regions (10,12).

The MEMS device may include a number of electrical-decoupling regions (31, 32, 33) of dielectric material, arranged on the structural layer (25), the first openings (35) being laterally staggered with respect to the electrical-decoupling regions (31, 32, 33); and wherein at least one portion of the ceiling layer (75) contacts a portion of a corresponding electrical-decoupling region (31,32,33); and wherein at least one portion of the ceiling layer (75) contacts a corresponding portion (49) of the structural layer (25), with which it forms a buttress structure (49, 75) laterally staggered with respect to the functional element (44, 46, 48).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a micro-electro-mechanical system (MEMS) device, the process comprising:

forming a first sacrificial dielectric region on a semiconductor wafer;

forming a structural layer of semiconductor material on the first sacrificial dielectric region;

forming a plurality of first openings through the structural layer, the plurality of first openings laterally defining, from the structural layer, at least one moveable mass over a rotor metalization and at least one stator over a conductive stator region, the first openings extending to the first sacrificial dielectric region;

forming a second sacrificial dielectric region on the structural layer and over the first openings;

forming a ceiling layer of semiconductor material on the second sacrificial dielectric region;

forming a plurality of second openings through the ceiling layer, the plurality of second openings extending to the second sacrificial dielectric region;

forming a permeable layer on the ceiling layer and over the plurality of second openings;

removing the first and the second sacrificial dielectric regions to release the at least one movable mass; and forming a sealing layer of semiconductor material on the permeable layer.

2. The process according to claim 1, further comprising:

forming a plurality of anchorage windows through the second sacrificial dielectric region, the ceiling layer extending into the plurality of anchorage windows.

3. The process according to claim 2, further comprising:

forming a number of electrical-decoupling regions of dielectric material on the structural layer, the first plurality of openings being laterally staggered with respect to the electrical-decoupling regions, the second sacrificial dielectric region extending on the structural layer and on the electrical-decoupling regions, at least one first anchorage window of the plurality of anchorage windows extending to a portion of a corresponding electrical-decoupling region, a portion of the ceiling layer that extends into the at least one first anchorage window contacting the portion of the corresponding electrical-decoupling region, at least one second anchorage window of the plurality of anchorage windows laterally staggered with respect to the electrical-decoupling regions and extending to the structural layer, a portion of the ceiling layer that extends into the at least one second anchorage window contacting a corresponding portion of the structural layer and forming a buttress structure laterally staggered with respect to the at least one movable mass.

4. The process according to claim 1, further comprising:

forming a plurality of preliminary windows through the first sacrificial dielectric region, the structural layer extending into the preliminary windows.

5. The process according to claim 4, wherein the semiconductor wafer includes:

a semiconductor substrate;

an insulating region on the semiconductor substrate, the insulating region including a number of recesses extending to the semiconductor substrate; and a plurality of conductive regions spaced from one another, at least one of the plurality of conductive regions extending on the insulating region and into at least one of the recesses, each of the plurality of preliminary windows extending to a corresponding conductive region or to the semiconductor substrate.

6. The process according to claim 5, further comprising:

forming a number of contacts on the semiconductor substrate and on a side opposite to the insulating region; and electrically connecting the contacts to corresponding conductive regions.

7. The process according to claim 6, further comprising:

positioning the semiconductor wafer on a temporary support; and reducing a thickness of the semiconductor substrate.

8. The process according to claim 5, wherein the first and the second sacrificial dielectric regions are removed by flowing a gas to flow through the permeable layer.

9. The process according to claim 8, wherein the gas is hydrofluoric acid, and the insulating region includes aluminium oxide.

10. The process according to claim 1, wherein the removing of the first and the second sacrificial dielectric regions causes formation of a cavity, which is in fluidic communication with the plurality of second openings, and the at least one functional element is suspended in the cavity.

11. The process according to claim 10, wherein the cavity is hermetically closed.

12. The process according to claim 1, wherein the structural layer, the ceiling layer, the permeable layer, and the sealing layer include polysilicon.

13. The process according to claim 1, wherein the first and the second sacrificial dielectric regions are removed by flowing a gas to flow through the permeable layer.

14. A method comprising:

forming a base region;

forming a structural layer including semiconductor material on the base region;

forming at least one movable mass of a micro-electro-mechanical system (MEMS) device over a rotor metalization and at least one stator over a conductive stator region by forming a plurality of first openings in the structural layer;

forming a ceiling layer of semiconductor material on the structural layer;

forming a plurality of second openings in the ceiling layer;

forming a permeable layer on the ceiling layer and over the plurality of second openings; and forming a sealing layer of semiconductor material on the permeable layer.

15. The method of claim 14, wherein the forming of the base region, the structural layer, and the ceiling layer include forming a cavity that is in fluidic communication with the plurality of second openings, and the functional element is suspended in the cavity.

16. The method of claim 14, wherein the forming of the base region includes:

forming an insulating region on a semiconductor substrate;

forming recesses in the insulating region; and forming a plurality of conductive regions on the insulating region and in the recesses, the structural layer contacting the semiconductor substrate and the conductive regions.

17. The method of claim 16, further comprising:

forming contacts on the semiconductor substrate, the contacts and the insulating region positioned on opposite sides of the semiconductor substrate.

18. The method of claim 17, further comprising:

reducing a thickness of the semiconductor substrate prior to the forming of the contacts.

19. A method, comprising:

forming a first sacrificial region on a semiconductor wafer;

forming a structural layer of semiconductor material on the first sacrificial region;

forming a plurality of first openings in the structural layer, the plurality of first openings exposing portions of the first sacrificial region, at least one of the plurality of first openings defining a movable mass in the structural layer over a rotor metalization and at least one stator over a conductive stator region;

forming a second sacrificial region on the structural layer, the second sacrificial region extending over the plurality of first openings;

forming a ceiling layer of semiconductor material on the second sacrificial region;

forming a plurality of second openings in the ceiling layer, the plurality of second openings exposing portions of the second sacrificial region;

forming a permeable layer on the ceiling layer, the permeable layer extending over the plurality of second openings;

releasing the movable mass in the structural layer by removing portions of the first sacrificial region and the second sacrificial region; and forming a sealing layer of semiconductor material on the permeable layer.

20. The method of claim 19, further comprising:

forming a plurality of anchorage windows in the second sacrificial region.

21. The method of claim 19, further comprising:

forming a plurality of electrical-decoupling regions on the structural layer.

22. The method of claim 19, further comprising:

forming a plurality of preliminary windows in the first sacrificial region.

23. The method of claim 19, wherein the semiconductor wafer includes:

a semiconductor substrate;

an insulating region on the semiconductor substrate; and a plurality of conductive regions on the insulating region.

24. The method of claim 23, further comprising:

forming a plurality of contacts on the semiconductor substrate.

25. The method of claim 19, wherein the removing of the portions of the first sacrificial region and the second sacrificial region include flowing a gas through the permeable layer.

26. The method of claim 19, wherein the removing of the portions of the first sacrificial region and the second sacrificial region includes forming a cavity, and the movable mass is in the cavity.

\* \* \* \* \*